United States Patent
Williams et al.

(10) Patent No.: US 6,400,631 B1
(45) Date of Patent: Jun. 4, 2002

(54) CIRCUIT, SYSTEM AND METHOD FOR EXECUTING A REFRESH IN AN ACTIVE MEMORY BANK

(75) Inventors: Michael W. Williams, Citrus Heights; Jim M. Dodd, Shingle Springs, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/662,728

(22) Filed: Sep. 15, 2000

(51) Int. Cl.[7] .............................................. G11C 13/04
(52) U.S. Cl. .............. 365/222; 365/230.03; 365/189.02
(58) Field of Search ........................... 365/222, 230.03, 365/189.02, 230.02

(56) References Cited

U.S. PATENT DOCUMENTS

| | | | | |
|---|---|---|---|---|
| 4,829,484 A | * | 5/1989 | Arimoto et al. | 365/222 |
| 4,979,145 A | * | 12/1990 | Remington et al. | 364/900 |
| 5,305,274 A | * | 4/1994 | Proebsting | 365/130.03 X |
| 5,659,515 A | * | 8/1997 | Matsuo et al. | 365/222 |

* cited by examiner

*Primary Examiner*—Huan Hoang
(74) *Attorney, Agent, or Firm*—Michael Nesheiwat

(57) ABSTRACT

A memory containing a plurality of memory banks and a plurality of sense amplifiers. Also, the memory device contains a multiplexer and logic. The logic receives a refresh request for one of the plurality of memory banks and instructs the multiplexer to select one of the plurality of sense amplifiers in response to the refresh request.

16 Claims, 2 Drawing Sheets

CIRCUIT, SYSTEM AND METHOD FOR EXECUTING A REFRESH IN AN ACTIVE MEMORY BANK

BACKGROUND OF THE INVENTION

1. Field of the Invention

The present invention relates to a dynamic random access memory, and specifically to a method and circuit for refresh of a volatile memory.

2. Description of the Related Art

A DRAM, or Dynamic Random Access Memory, contains a memory cell array having a plurality of individual memory cells arranged as a matrix of rows and columns. Each memory cell is coupled to one of a plurality of bit lines and to one of a plurality of word lines. This matrix is usually subdivided into a number of banks. When a DRAM delivers data from a bank, an entire row of data from the memory cells is moved from the matrix into an array of sense amplifiers, a process known as "opening a page". Subsequently, the sense amplifiers transfer a subset of the data to the DRAM device pins. Once the data has been delivered to the pins, the sense amplifiers restore the data to the memory cell, and the page can be "closed".

Each memory cell in a DRAM is constructed from a single transistor and a single capacitor and is called dynamic because its data decays and becomes invalid due to various leakage current paths to surrounding cells and to the substrate. Therefore, to keep the data in the cells valid, each memory cell is periodically refreshed. Data in the DRAM cell array is refreshed every time it is read out of the cell array into the sense amplifiers and subsequently rewritten into the cells.

The agent that reads data out of DRAM and writes data into DRAM is known as a memory controller or DRAM controller. This memory controller is responsible for opening and closing pages, reading and writing data, and for periodically performing refresh maintenance operations on the memory cell array. Every row of the memory array needs to be refreshed before the data in the row decays to an invalid state. The typical refresh time period for one row of the DRAM array is a few microseconds. In addition, memory controllers are often designed so that they leave pages in the open state for prolonged periods of time in order to enhance memory system performance. However, since the sense amplifiers are used for the refresh operation, a fundamental conflict arises between convenient execution of refresh requests and a high-performance paging policy.

This conflict has been resolved in a few ways. One current solution is closing open pages that interfere with necessary refresh operations. Another existing solution is delaying refresh operations if there is an interference with pages that are currently open. The first policy degrades memory access operations in favor of timely refresh. The second policy also addresses the conflict, but does not fully utilize the bandwidth of the DRAM interface because of the intentional delay of the refresh operations. Yet another existing solution, depicted in FIG. 1, is generating a register for each memory bank and sense amplifier pair for storing the contents of the sense amplifier into the register. However, the resulting memory design is extremely inefficient due to the large number of transistors needed to generate a register for each memory bank and sense amplifier pair.

BRIEF DESCRIPTION OF THE SEVERAL VIEWS OF THE DRAWINGS

The present invention is illustrated by way of example and not limitation in the following FIGS. Like references indicate similar elements, in which.

DETAILED DESCRIPTION OF THE INVENTION

A circuit, system, and a method for refreshing a dynamic random access memory are described. In the following description, for purposes of explanation, numerous details are set forth in order to provide a thorough understanding of the present invention. However, it will be apparent to one skilled in the art that these specific details are not required in order to practice the present invention.

Figure 1:
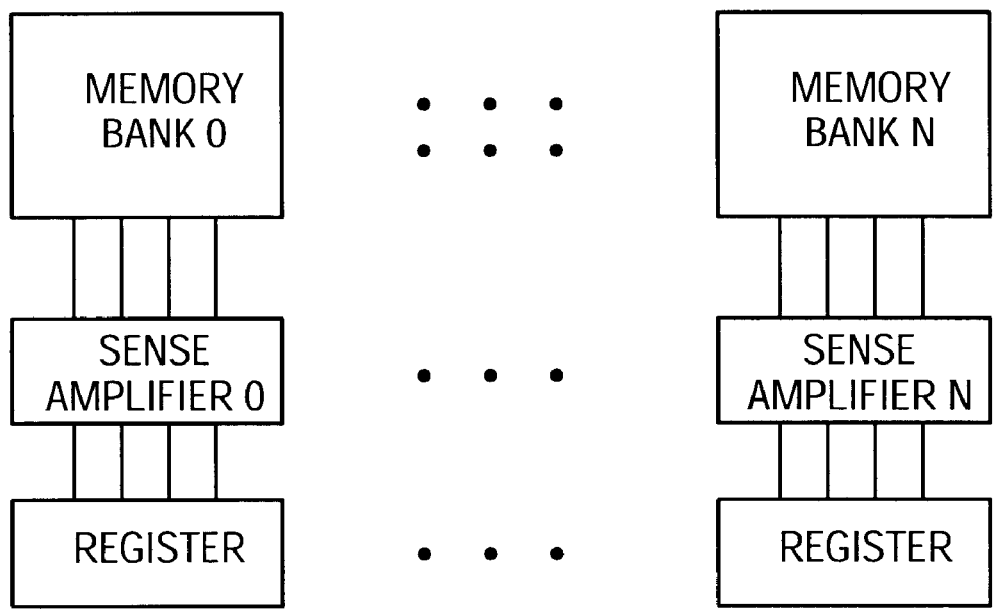
FIG. 1 illustrates a prior-art diagram utilized by an embodiment of the present invention.
Figure 2:
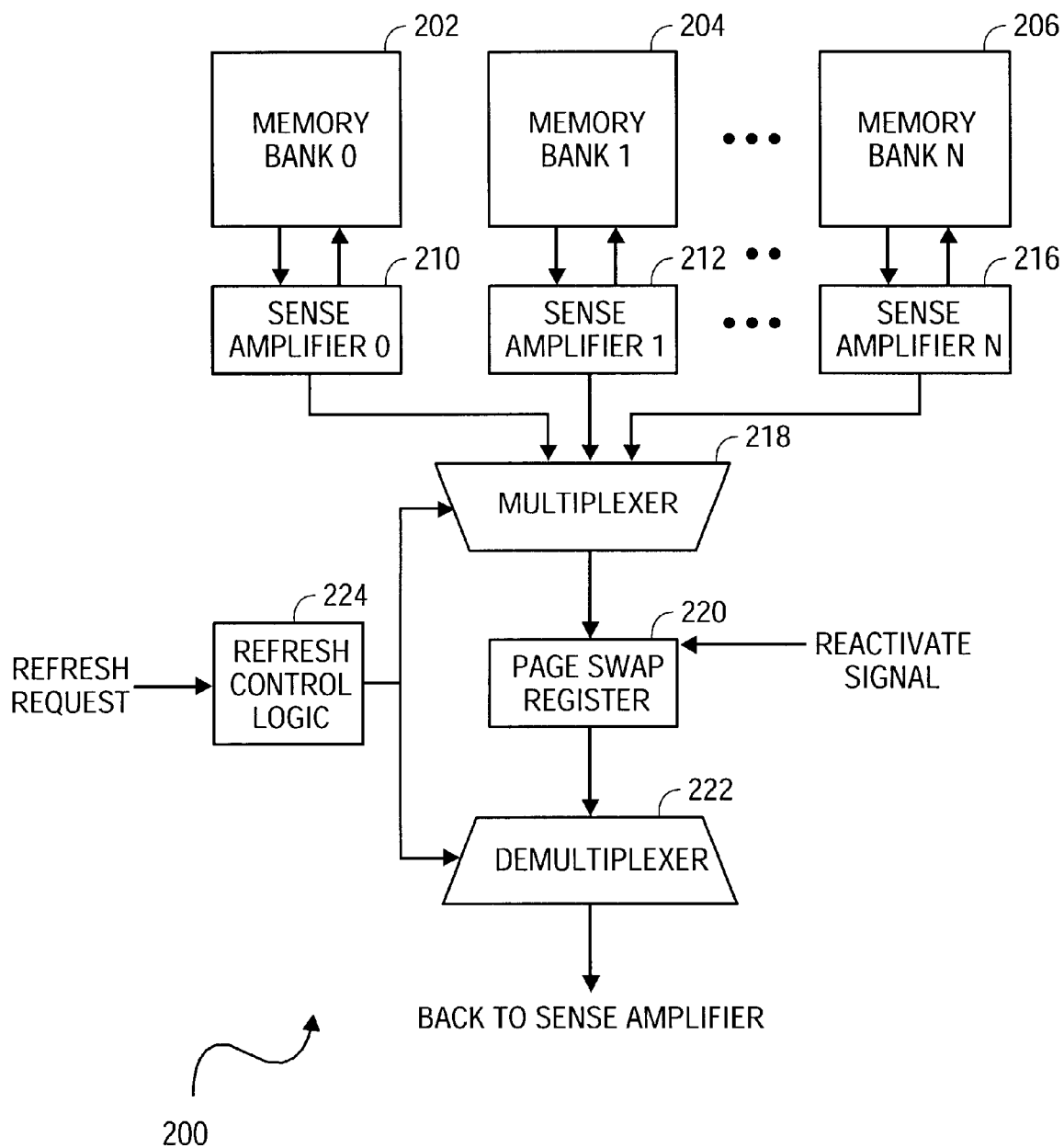
FIG. 2 illustrates a diagram of a circuit utilized by an embodiment of the present invention.

FIG. 2 illustrates diagram of a circuit 200 utilized by an embodiment of the present invention. The circuit 200 comprises memory banks 202–208 coupled to one of a plurality of sense amplifiers 210–216. The memory bank may have an open status, where one row of data is loaded into its respective sense amplifier. The sense amplifiers 210–216 are coupled to a multiplexer 218. The multiplexer 218 selects one of the sense amplifiers coupled to a memory bank with an open status and requiring a refresh operation, in response to a refresh control logic 224. Also, the mulitiplexer 218 forwards the contents of the sense amplifier to be stored in a page swap register 220. In one embodiment, the page swap register 220 is coupled to the sense amplifiers via a demultiplexer 222. In another embodiment, the page swap register 220 restores the contents of a sense amplifier for one memory bank in response to a re-activate signal. In yet another embodiment, a memory controller comprises the refresh control logic 224, and a memory device comprises the memory banks, sense amplifiers, multiplexer, page swap register, and the demultiplexer. In still yet another embodiment, a memory device comprises refresh control logic, memory banks, sense amplifiers, multiplexer, page swap register, and the demultiplexer.

The memory banks 202–208 require a periodic refresh operation to restore the charge in the memory cell to insure data integrity. Thus, a refresh request for each memory bank is issued on a periodic basis. For example, if a refresh operation is needed for memory bank 202 a refresh request is sent to the refresh control logic 224. The refresh request specifies a sense amplifier. The refresh control logic 224 checks the status of sense amplifier 210. If the sense amplifier is busy, a conflict, the refresh control logic waits and repeats checking the status until the sense amplifier 210 resolves the conflict. Next, the refresh control logic 224 instructs the multiplexer 218 to select the contents of sense amplifier 210, corresponding to the refresh request, to be forwarded to the page swap register 220.

Upon the completion of the refresh operation on memory bank 202, the sense amplifier 210 is restored when the refresh control logic 224 instructs the demultiplexer 222 to forward the contents of the page swap register 220 to the respective sense amplifier corresponding to the refresh request. In another embodiment, the page swap register 220 restores the sense amplifier 210 in response to the re-activate signal. Thus, unless there is a write to the memory bank, the refresh operation on the memory bank is transparent to the sense amplifier 210 because it is restored to the same state as before the refresh operation. If multiple memory banks need a refresh operation, the procedure is repeated for each memory bank.

The invention has the advantage of minimizing the amount of logic needed because only one page swap register is needed for all the memory banks. Also, performance of the memory is increased because the invention eliminates the need to re-activate the memory bank after the completion of the refresh operation, in essence, the memory bank retains an active working set during the refresh operation.

In one embodiment, a memory device comprises the memory banks 202–208 and the sense amplifiers 210–216 and a memory controller comprises the refresh control logic 224, multiplexer 218, page swap register 220, and demultiplexer 222. In another embodiment, a memory module comprises a memory interface and a memory device. The memory device comprises the memory banks 202–208 and the sense amplifiers 210–216. The memory interface comprises the refresh control logic 224, multiplexer 218, page swap register 220, and demultiplexer 222. The memory interface is coupled to either a chipset, memory controller, or microprocessor.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fillest allowable scope of the claims that follow.

What is claimed is:

1. A memory device comprising:
   at least one memory bank and at least one sense amplifier;
   a multiplexer, coupled to the sense amplifier;
   a logic, coupled to the multiplexer, to receive a refresh request for the memory bank and instruct the multiplexer to select the sense amplifier in response to the refresh request; and
   a register coupled to the multiplexer, to store a set of data.

2. The memory device of claim 1 wherein the logic instructs the multiplexer to select a sense amplifier to forward to the register in response to the refresh request.

3. The memory device of claim 1 further comprising a demultiplexer coupled to the register to restore the sense amplifier with the set of data from the register.

4. The memory device of claim 1 wherein the logic generates a re-activate signal to restore the sense amplifier with the set of data from the register upon the completion of the refresh request.

5. The memory device of claim 1 wherein the set of data is a current state of the sense amplifier coupled to a memory bank with an open status in response to the refresh request.

6. A method comprising:
   receiving a refresh request to a memory bank with an open status;
   selecting a sense amplifier coupled to the memory bank;
   storing a set of data of the sense amplifier in a register in response to the refresh request; and
   re-storing the sense amplifier with the set of data from the register.

7. The method of claim 6 wherein selecting a sense amplifier is in response to the refresh request and comprises forwarding the current state of the sense amplifier to the register via a multiplexer.

8. The method of claim 6 wherein re-storing the sense amplifier with the set of data from the register comprises completing the refresh request to the memory bank.

9. The method of claim 6 wherein re-storing the sense amplifier with the set of data from the register comprises forwarding the set of data from the register in response to a re-activate signal.

10. A system comprising:
    a processor;
    a memory device coupled to the processor, the memory device comprising a plurality of memory banks and a plurality of sense amplifiers;
    a multiplexer coupled to the memory device;
    a register coupled to the memory device;
    a logic coupled to the memory device, to receive a refresh request to one of the plurality of memory banks, the logic to instruct the multiplexer to store a set of data in a register corresponding to the refresh request.

11. The system of claim 10 further comprising a demultiplexer coupled to the register to restore one of the plurality of sense amplifiers with the set of data from the register.

12. The system of claim 10 wherein the set of data is a current state of one of the plurality of sense amplifiers coupled to a memory bank with an open status in response to the refresh request.

13. The system of claim 10 wherein the logic generates a re-activate signal to restore the sense amplifier with the set of data from the register upon the completion of the refresh request.

14. The system of claim 10 wherein the control signal instructs the multiplexer to select a sense amplifier to forward to the register.

15. The system of claim 10 wherein a memory controller coupled to the memory device, comprises the logic.

16. The system of claim 10 wherein the memory device is coupled to either one of the processor, a memory controller, or a chipset, and the memory device comprises the logic.

* * * * *